(12) United States Patent
Kim

(10) Patent No.: US 7,358,533 B2
(45) Date of Patent: Apr. 15, 2008

(54) ELECTRONIC DEVICE, THIN FILM TRANSISTOR STRUCTURE AND FLAT PANEL DISPLAY HAVING THE SAME

(75) Inventor: Eun-Ah Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 148 days.

(21) Appl. No.: 11/170,157

(22) Filed: Jun. 30, 2005

(65) Prior Publication Data

US 2006/0011980 A1    Jan. 19, 2006

(30) Foreign Application Priority Data

Jun. 30, 2004    (KR)    ...................... 10-2004-0050444

(51) Int. Cl.
*H01L 29/04*    (2006.01)
*H01L 29/15*    (2006.01)
*H01L 31/036*    (2006.01)
*H01L 29/47*    (2006.01)
*H01L 31/07*    (2006.01)

(52) U.S. Cl. ........................... 257/72; 257/57; 257/58; 257/59; 257/66; 257/73

(58) Field of Classification Search ............ 257/57–59, 257/66, 72–73
See application file for complete search history.

(56) References Cited

U.S. PATENT DOCUMENTS

| | | | |
|---|---|---|---|
| 4,820,024 A * | 4/1989 | Nishiura | ...................... 349/50 |
| 4,884,143 A * | 11/1989 | Uya | ............................ 348/315 |
| 5,940,056 A | 8/1999 | Hanazawa et al. | |
| 5,969,779 A | 10/1999 | Kim et al. | |
| 6,614,494 B2 * | 9/2003 | Kawai et al. | .................. 349/54 |
| 7,139,056 B2 * | 11/2006 | Nishikawa et al. | ......... 349/129 |
| 7,208,766 B2 * | 4/2007 | Yamazaki et al. | ............ 257/72 |
| 2001/0040648 A1 * | 11/2001 | Ono et al. | ..................... 349/43 |
| 2002/0085157 A1 | 7/2002 | Tanaka et al. | |
| 2002/0093290 A1 | 7/2002 | Yamazaki | |
| 2002/0180902 A1 * | 12/2002 | Izumi et al. | ................... 349/43 |
| 2003/0234364 A1 * | 12/2003 | Hennessy et al. | ...... 250/370.14 |
| 2004/0169781 A1 * | 9/2004 | Lee et al. | ..................... 349/54 |
| 2004/0232424 A1 * | 11/2004 | Hotta et al. | .................... 257/72 |

(Continued)

FOREIGN PATENT DOCUMENTS

EP    1049176 A2    11/2000

(Continued)

*Primary Examiner*—Ida M. Soward
(74) *Attorney, Agent, or Firm*—H.C. Park & Associates, PLC

(57) ABSTRACT

The present invention provides an electronic device having more than two conductive layers that cross but not in contact with each other. At least one of the conductive layers comprises a width change part, a width of which changes in a length direction of at least one of the conductive layer. The width change part is formed away from a region of at least one of the conductive layers that crosses a neighboring conductive layer. The present invention also provides a flat panel display device that includes the electronic device described above and manufactured in accordance with the principles of the present invention. The electronic device of the present invention may comprise a thin film transistor.

22 Claims, 8 Drawing Sheets

U.S. PATENT DOCUMENTS

| | | | |
|---|---|---|---|
| 2004/0245524 A1* | 12/2004 | Hirakata et al. | 257/59 |
| 2004/0246395 A1* | 12/2004 | Chang | 349/55 |
| 2004/0262611 A1* | 12/2004 | Lai | 257/72 |
| 2005/0046773 A1* | 3/2005 | Nakayoshi et al. | 349/139 |
| 2007/0035532 A1* | 2/2007 | Amundson et al. | 345/204 |

FOREIGN PATENT DOCUMENTS

| | | |
|---|---|---|
| JP | 2001044438 A1 | 2/2001 |
| JP | 2001345177 A1 | 12/2001 |
| KR | 1020000022518 A | 4/2000 |

* cited by examiner

ELECTRONIC DEVICE, THIN FILM TRANSISTOR STRUCTURE AND FLAT PANEL DISPLAY HAVING THE SAME

CROSS-REFERENCE TO RELATED APPLICATIONS

This application claims priority to Korean Patent Application No. 10-2004-0050444, filed on Jun. 30, 2004, in the Korean Intellectual Property Office, the disclosure of which is herein incorporated by reference in its entirety.

BACKGROUND OF THE INVENTION

1. Field of the Invention

The present invention generally relates to electronic devices, such as thin film transistors (TFTs) and flat panel display devices including the same, and more particularly, to an electronic device, and flat panel display device including the same, in which electrostatic damage caused by static electricity is prevented or reduced.

2. Description of the Related Art

Many kinds of display devices are used for displaying images. Recently, a variety of flat panel display devices have replaced cathode ray tubes (CRTs). Flat panel display devices may be classified as either emissive or non-emissive, depending on the type of light emission used. Emissive display devices include CRTs, plasma display panel devices, vacuum fluorescent display devices, field emission display devices, and organic/inorganic electro-luminescent display devices, and non-emissive display devices include liquid crystal display devices. Flat panel emissive organic electroluminescent display (OELD) devices draw attention since they do not include a light emitting device, such as a back light, and are capable of operating with low power consumption and at high efficiency. Advantages of OELD devices include low operating voltage, a light weight, a thin profile, wide viewing angles, and fast video response times.

A conventional electroluminescent unit of an OELD device includes a first electrode (anode) that is formed in a stack on a substrate, a second electrode (cathode), and an organic light-emitting layer (thin film) interposed between the first and second electrodes. In operation, OELD devices emit light of a specific wavelength using energy generated from exitons formed from recombining electrons injected from the anode and holes injected from the cathode into the organic thin film. To increase the efficiency of light emission, an electron transport layer (ETL) may be interposed between the cathode and the organic emitting layer. Similarly, a hole transport layer (HTL) may be interposed between the anode and the organic emitting layer. Also, a hole injection layer (HIL) may be disposed between the anode and the HTL and an electron injection layer (EIL) may be interposed between the cathode and the ETL.

A passive matrix organic electro-luminescent display (OELD) device uses a manual driving method, while an active matrix (AM) OELD device uses an active driving method. In the passive matrix OELD device, the anodes are arranged in columns and the electrodes are arranged in rows. Scanning signals are supplied to the cathodes from a row driving circuit, and data signals are supplied to each pixel from a column driving circuit. On the other hand, the active matrix OELD device controls a signal inputted to a pixel using a thin film transistor (TFT) and is widely used for implementing animation since it is suitable for processing a large number of signals virtually simultaneously.

A disadvantage associated with conventional active matrix OELD devices is that one or more faulty pixels may develop in the devices display regions due to static electricity generated when manufacturing, or operating, the OELD devices. Examples of correctly functioning and faulty pixels are shown in FIG. 1A, FIG. 1B, and FIG. 1C.

FIG. 1A is a plan view photograph of a conventional OELD device that shows faulty pixels as bright spots. FIG. 1B is a magnified photograph of a normal pixel indicated as A in FIG. 1A, and FIG. 1C is a magnified photograph of faulty pixel indicated as B in FIG. 1A. FIGS. 1B and 1C are bottom views of the conventional OELD device of FIG. 1A. These bottom views are taken from the OELD's substrate side looking through the multilayered structure of the substrate and the various electrical and electroluminescent components formed on it. Thus, in FIGS. 1B and 1C, the gate lines $3a$ and $3b$ appear to be positioned above the conductive layer 5.

In FIGS. 1B and 1C, each of the pixels $1a$ and $1b$ comprises an electroluminescent unit, a gate electrode ($2a$ in FIG. 1A and $2b$ in FIG. 1B), and a light emitting thin film transistor (Ma in FIG. 1B and Mb in FIG. 1C) that transmits electrical signals from a driving thin film transistor (not shown) to the pixel. Source electrodes of the light emitting thin film transistors Ma and Mb are electrically connected to the driving thin film transistors (not shown) via conductive layers 5.

FIG. 1D is a magnified plan view of a portion indicated as B' in FIG. 1C. Referring to FIG. 1D, a conductive layer 5 may extend across other conductive layers. In the magnified bottom view of FIG. 1D, for example, the conductive layer 5 is shown crossing the gate line $3b$. In this exemplary drawing, the gate line $3b$ appears to be positioned above the conductive layer 5. In operation, the gate line $3b$ may act as a scan line and/or an extension unit of a scan line for supplying electrical signals to a thin film transistor.

To meet design specifications, the width of each gate line $3b$ may change along a length thereof. In the conventional design illustrated in FIGS. 1B, 1C, and 1D, for example, each gate line $3b$ changes in width at a portion thereof that crosses the conductive layer 5. As shown in FIG. 1D, the wider portion of the gate line $3b$ may be a width change part $A_w$, and a narrower connected portion of the gate line $3b$ may be a crossing unit $A_c$. Both the width change part $A_w$ and the crossing unit $A_c$ are positioned above the conductive layer 5 and within the side bounds thereof. During manufacture of the conductive layers, the conductive layer 5 may accumulate an electrostatic charge. Because electricity tends to discharge at pointed regions of a conductor, an electrostatic discharge (ESD) tends to occur at angled portions $A_d$ of the width change part Aw shown in FIG. 1D. In most cases, the ESD damages the corresponding pixel $1a/1b$, causing it to overluminate (e.g, appear as a bright spot, such as the bright spot B shown in FIG. 1A). Such an electrostatic discharge is easily induced since static electricity is concentrated at the crossing portion, and thus the possibility of generating a short circuit between conductive layers increases if an insulating layer interposed between the conductive layers is damaged. As depicted in FIGS. 1B and 1C, even though the same desired electrical signal is inputted to the pixel $1a$ in FIG. 1B and the pixel $1b$ in FIG. 1C, the pixel $1b$ in FIG. 1C malfunctions and produces a bright spot having a greater brightness than the normal pixel $1a$ in FIG. 1B. The greater brightness occurs because the short circuit between different conductive layers $3b$ and 5 creates and applies a different electrical signal than one that is desired. This undesired electrostatic discharge may seriously degrade a flat panel OELD device's picture quality, which requires high uniformity over an entire display region of the OELD.

SUMMARY OF THE INVENTION

The present invention provides an electronic device in which the generation of faulty pixels caused by electrostatic damage of conductive layers is reduced or prevented and a flat panel organic electroluminescent display (OELD) device having the same.

An aspect of the present invention, provides an electronic device comprising more than two conductive layers crossing but not in contact with each other, wherein at least one of the conductive layers comprises a width change part, a width of which changes in a length direction of the at least one of the conductive layers and the width change part is formed away from a region where the at least one of the conductive layers crosses a neighboring conductive layer.

Another aspect of the present invention, provides a thin film transistor (TFT) structure comprising more than two conductive layers crossing but not in contact with each other, wherein at least one of the conductive layers comprises a width change part, a width of which changes in a length direction of the at least one of the conductive layers and the width change part is formed away from a region where the at least one of the conductive layers crosses a neighboring conductive layer.

Another aspect of the present invention, provides a flat panel display device comprising a substrate, a TFT layer formed on the substrate, and a pixel layer that comprises more than one pixel electrically connected to the TFT layer, wherein the TFT layer comprises more than two conductive layers crossing but not in contact with each other, wherein at least one of the conductive layers comprises a width change part having a width that changes in a length direction of the at least one of the conductive layers, and wherein the width change part is formed away from a region where the at least one of the conductive layers crosses a neighboring conductive layer.

Another aspect of the present invention, provides an electronic device comprising more than two conductive layers crossing but not in contact with each other, wherein at least one of the conductive layers comprises a part whose cross section area changes in a length direction of the at least one of the conductive layers and the part whose cross section area changes is formed away from a region where the at least one of the conductive layers crosses a neighboring conductive layer.

Another aspect of the present invention, provides a thin film transistor (TFT) structure comprising more than two conductive layers crossing but not in contact with each other, wherein at least one of the conductive layers comprises a part whose cross section area changes in a length direction of the at least one of the conductive layers and the part whose cross section area changes is formed away from a region where the at least one of the conductive layers crosses a neighboring conductive layer.

Another aspect of the present invention, provides a flat panel display device comprising a substrate, a TFT layer formed on the substrate, and a pixel layer that comprises more than one pixel electrically connected to the TFT layer, wherein the TFT layer comprises more than two conductive layers crossing but not in contact with each other, wherein at least one of the conductive layers comprises a part whose cross section area changes in a length direction of the at least one of the conductive layers, and wherein the part whose cross section area changes is formed away from a region where the at least one of the conductive layers crosses a neighboring conductive layer.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

The present invention will now be described more fully with reference to the accompanying drawings in which exemplary embodiments of the invention are shown.

Figure 1A:
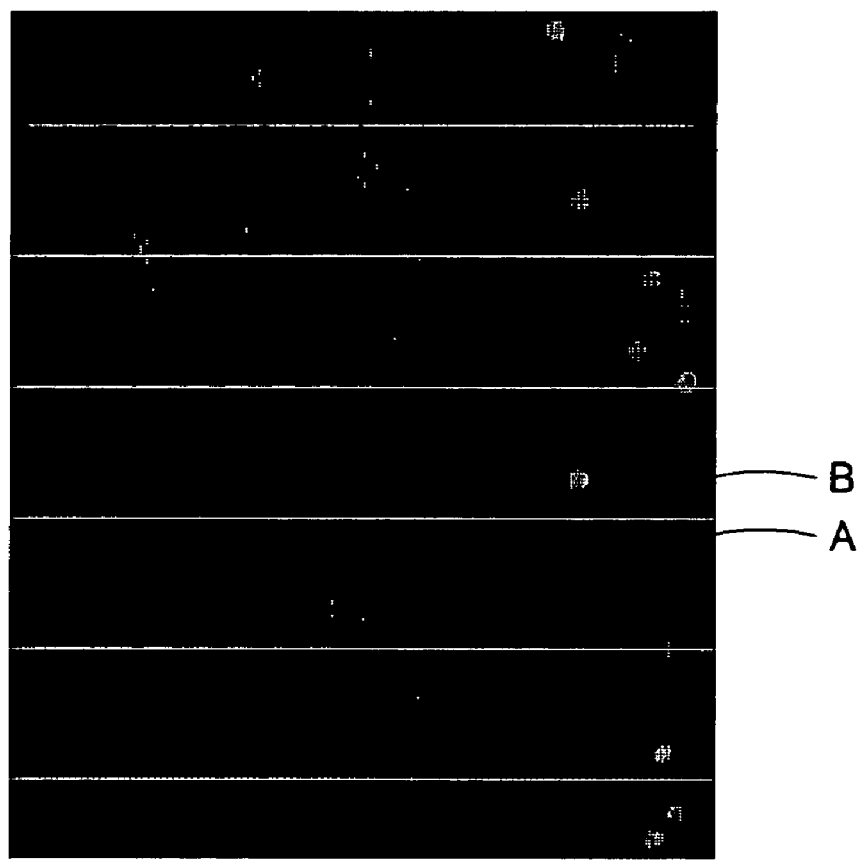
FIG. 1A is a photograph of a display region of a conventional organic electro-luminescent display device.
Figure 1B:
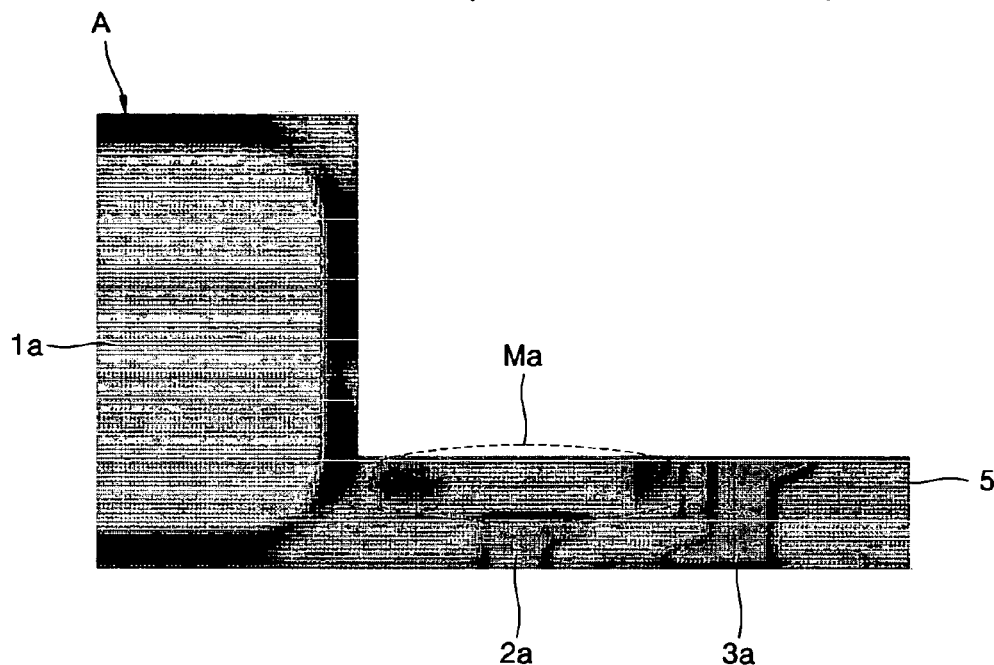
FIG. 1B is a partially magnified photograph of a normal pixel indicated as A in FIG. 1A.
Figure 1C:
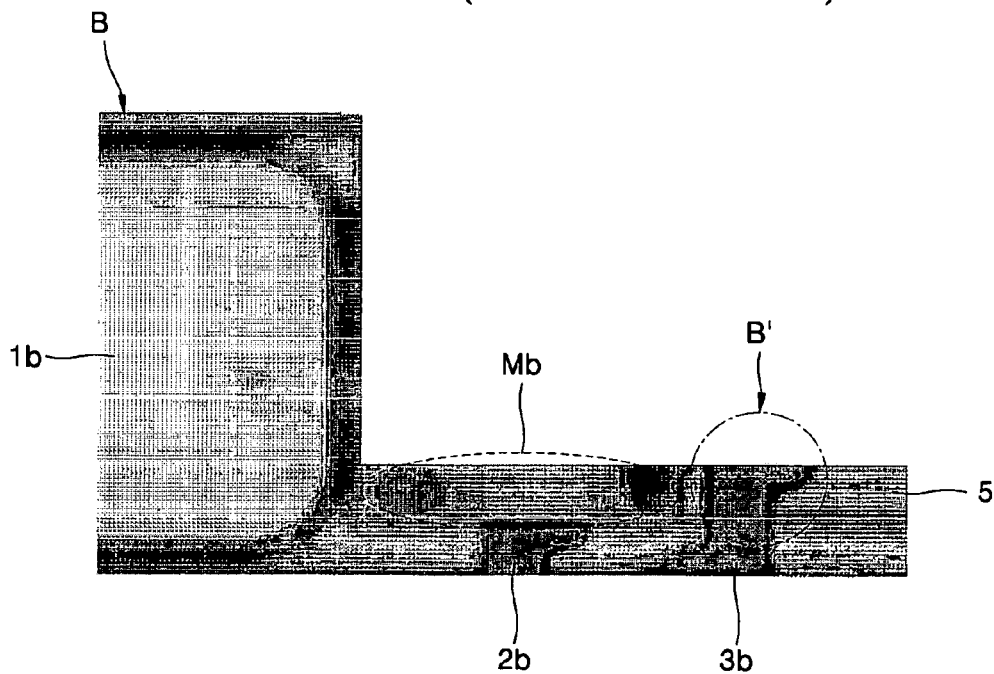
FIG. 1C is a partially magnified photograph of a faulty pixel indicated as B in FIG. 1A.
Figure 1D:
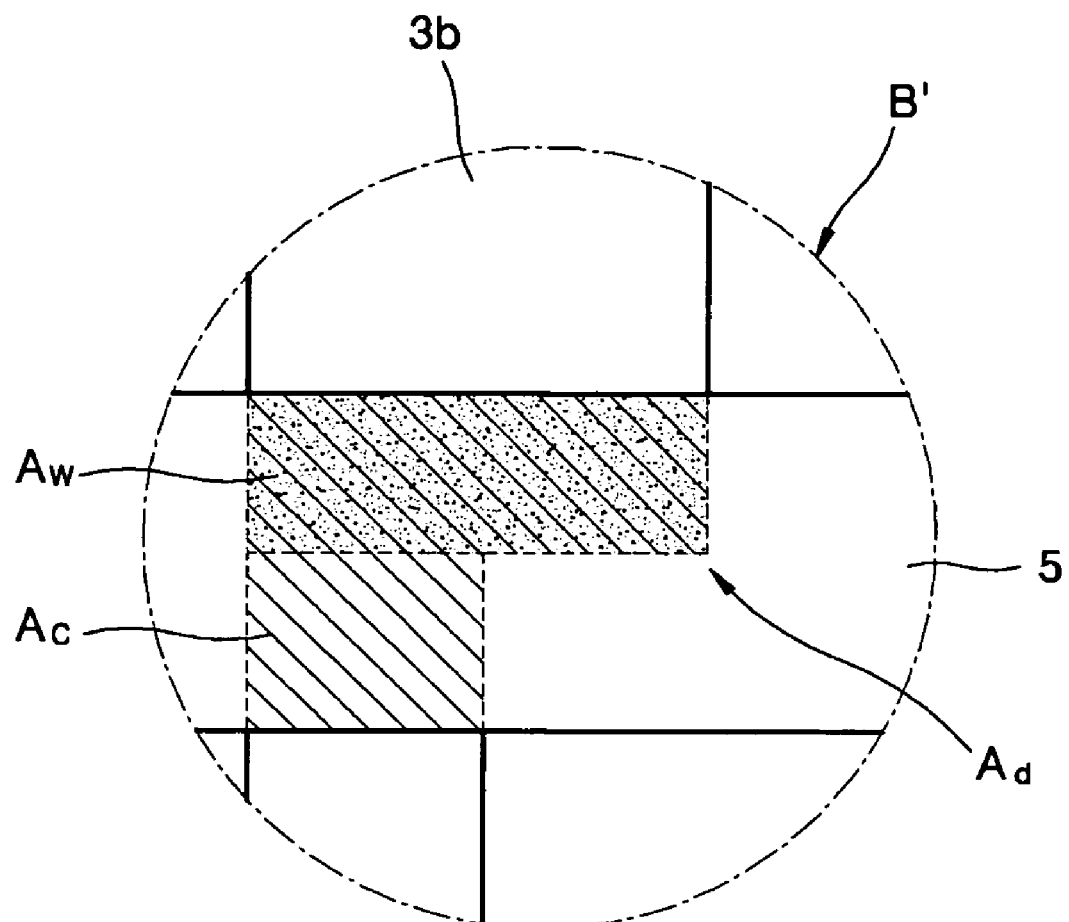
FIG. 1D is a magnified bottom view of a portion of the pixel indicated as B' in FIG. 1C.
Figure 1E:
FIG. 1E is a photograph of a cross-section of a portion of the pixel indicated as B' in FIG. 1C.
Figure 2A:
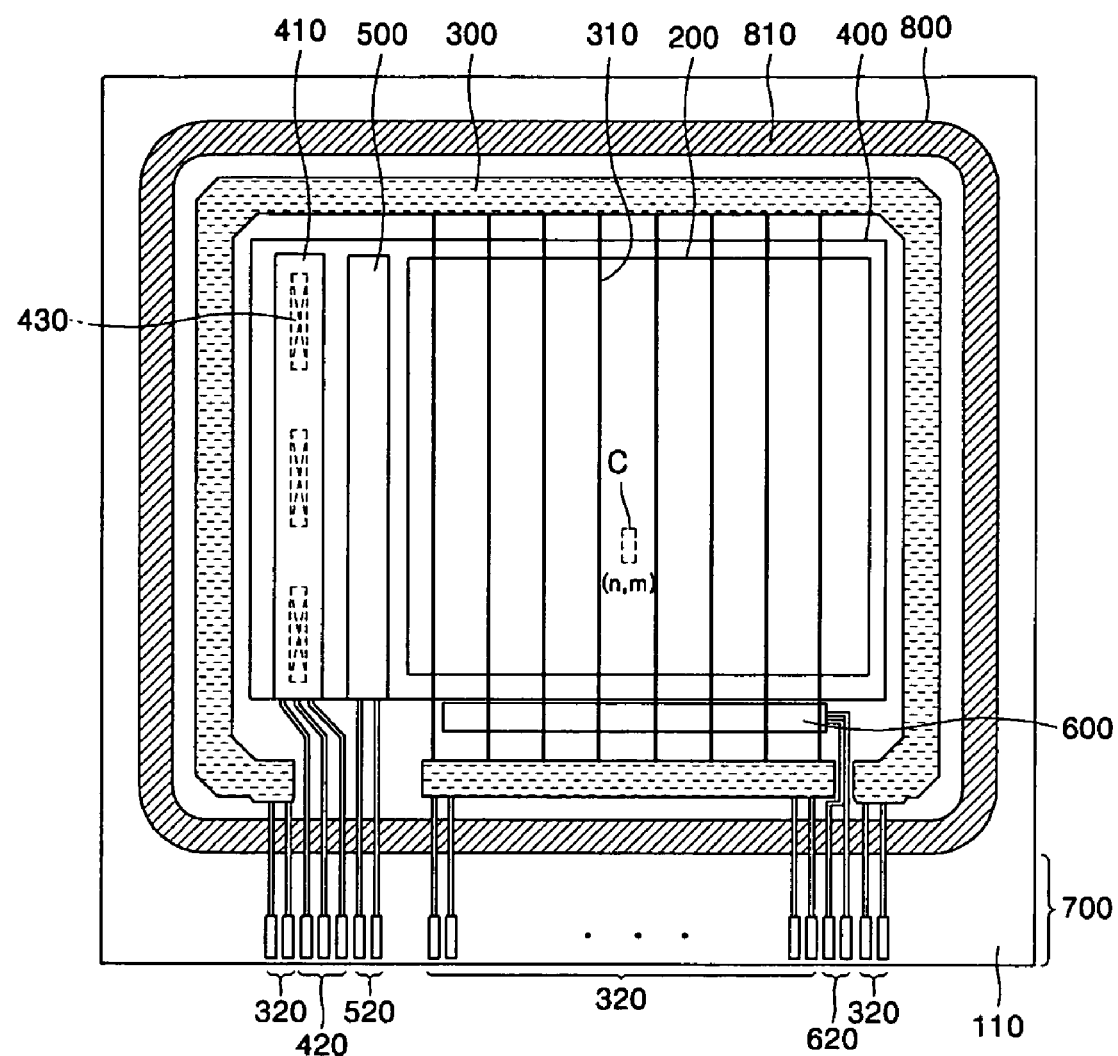
FIG. 2A is a schematic plan view of an organic electro-luminescent display manufactured according to the principles of the present invention.

FIG. 2A is a schematic plan view of an organic electro-luminescent display (OELD) manufactured according to the principles of the present invention. Referring to FIG. 2A, a substrate 110 comprises a display region 200 on which a light emitting device such as an organic electro-luminescent display device is disposed, a sealing member 800 that seals the substrate 110 and a sealing substrate (not shown) along the edge of the display region 200, and a terminal region 700 on which various terminals are disposed. However, the present invention is not limited thereto and can be embodied in many different forms. For example, a sealing layer that acts as a sealing member may be included.

A driving power supply line 300 for supplying power to the display region 200 may be disposed between the display region 200 and the sealing member 800. FIG. 2A illustrates an example of a driving power supply line of the present invention, but the present invention is not limited thereto. To ensure a uniform brightness of the display region 200, the driving power supply line 300 may surround the display region 200 to supply a uniform driving power to the entirety of the display region 200.

Figure 2B:
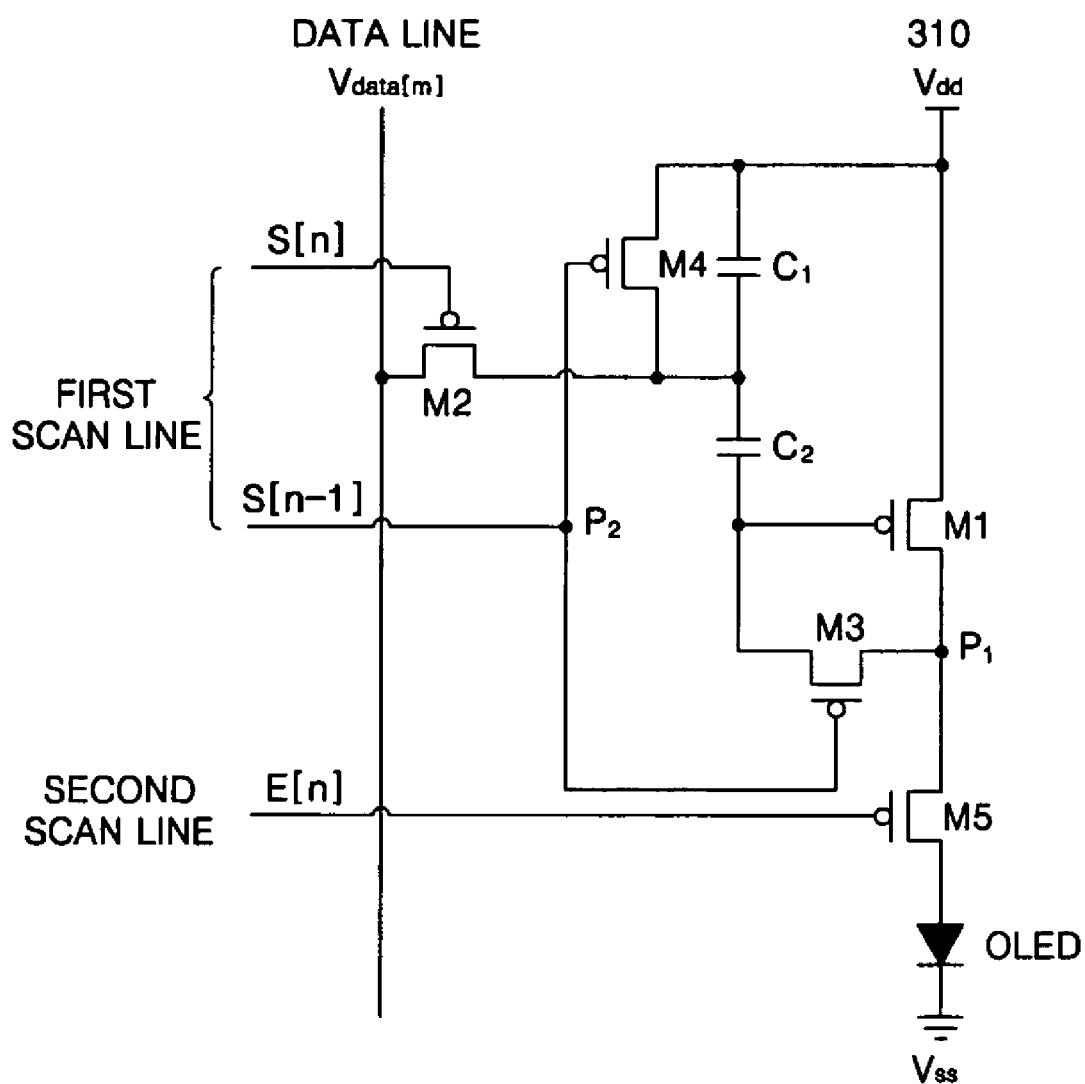
FIG. 2B is a schematic circuit diagram of a pixel of the OELD device indicated as C in FIG. 2A.
Figure 2C:
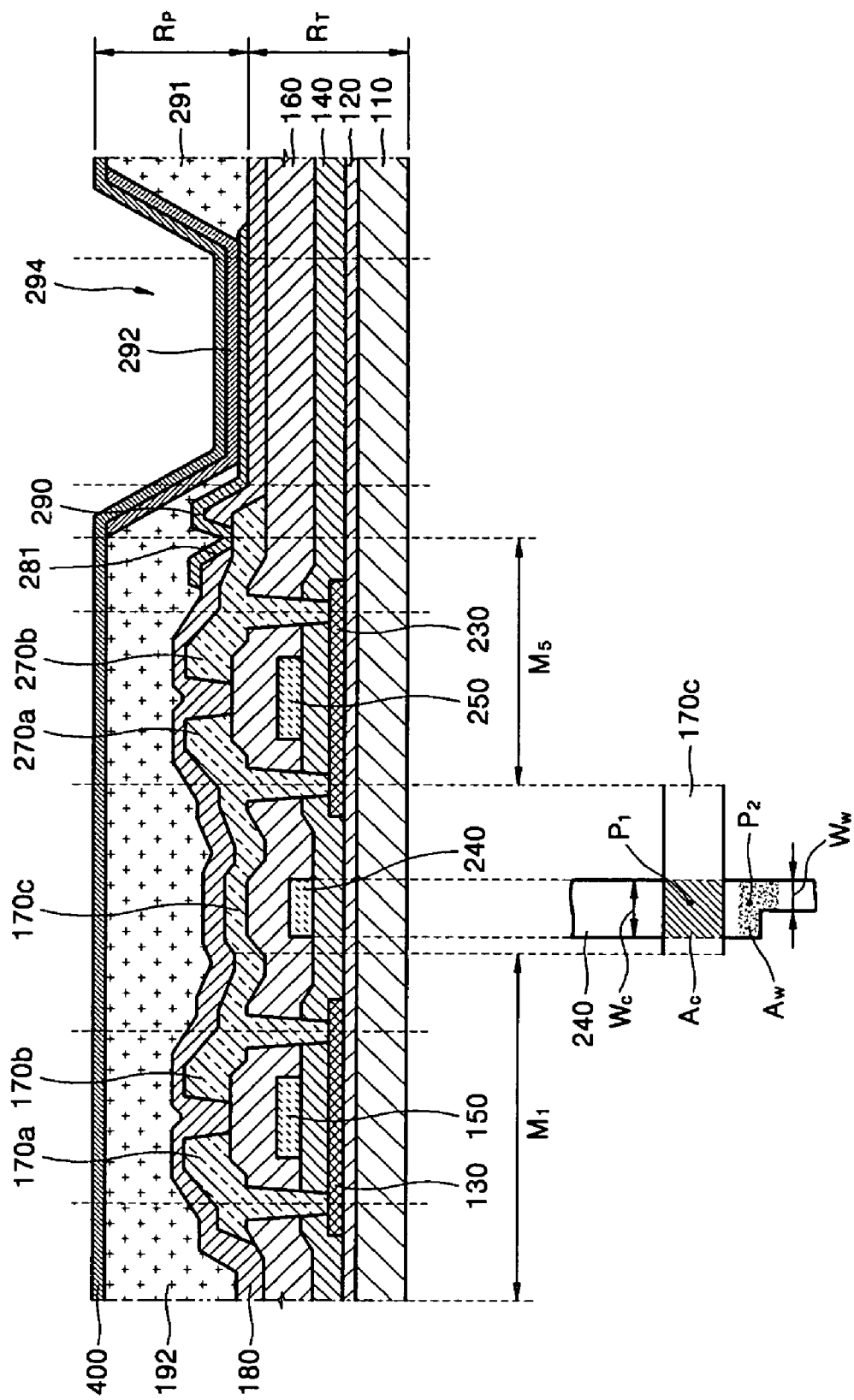
FIG. 2C is a partial cross-sectional view of the pixel indicated as C in FIG. 2A.

The driving power supply line 300 may connect to a driving power line 310, and the driving power line 310 may extend across the display region 200 and electrically connect to a source electrode 170a (refer to FIG. 2C) disposed under a protection layer 180 (refer to FIG. 2C).

Also, vertical and horizontal driving circuit units 500 and 600 may be disposed outside the boundaries of the display region 200. The vertical circuit unit 500 may be a scan driving circuit unit that supplies scan signals to the display region 200, and the horizontal driving circuit unit 600 may be a data driving circuit unit that supplies data signals to the display region 200. The vertical and horizontal driving circuit units 500 and 600 may be disposed outside the boundaries of the sealing region as an external IC or COG unit.

An electrode power supply line 410 that supplies electrode power to the display region 200 may be disposed outside the boundaries of the display region 200. The power supply line 410 may electrically connect to a second electrode layer formed on an upper part of the display region 200 through via holes 430 in insulating layers formed between the electrode power supply line 410 and the second electrode layer.

The driving power supply line 300, the electrode power supply line 410, and the vertical and horizontal driving circuit units 500 and 600 may include terminals 320, 420, 520, and 620, respectively, and are electrically connected to a terminal unit 700 disposed outside of the sealing region via wires.

The display region 200 comprises a plurality of pixels, which will now be described with reference to FIGS. 2B and 2C. FIG. 2B is a schematic circuit diagram of a pixel in an $n^{th}$ column and an $m^{th}$ row of the OELD device of the present embodiment indicated as C in FIG. 2A.

The pixel shown in FIG. 2B comprises five transistors and two capacitors, and each of the transistors is depicted as a PMOS TFT, but the present invention is not limited thereto.

In use, first scan signals and second scan signals are inputted to the display region 200 (refer to FIG. 2A) from the vertical circuit unit 500 via pluralities of first scan lines and second scan lines, respectively. First scan signals $S_{[n]}$ and $S_{[n-1]}$ and the second scan signal $E_{[n]}$ are inputted via the first scan line and the second scan line and a data voltage $V_{data[m]}$, which is a data signal, is inputted via the data line to the pixel in the $n^{th}$ column and $m^{th}$ row indicated as C in FIG. 2A.

A first TFT $M_1$ supplies a current to the OLED corresponding to the data voltage applied to the first TFT $M_1$ through a second TFT $M_2$.

The second TFT $M_2$ switches the data voltage applied to the data line in response to the nth select signal $S_{[n]}$ supplied to the first scan line.

A third TFT $M_3$ diode-connects the first TFT $M_1$ in response to the $(n-1)^{th}$ select signal $S_{[n-1]}$ supplied to the first scan line.

A fourth TFT $M_4$ supplies a constant voltage to one terminal of a first capacitor $C_1$ in response to the $n-1^{th}$ select signal $S_{[n-1]}$ supplied to the first scan line.

A fifth TFT $M_5$ transmits a current supplied from the first TFT $M_1$ to the OELD in response to the light emitting signal $E_{[n]}$ applied to the second scan line.

The first capacitor $C_1$ maintains at least a portion of a voltage between a gate and a source of the first TFT $M_1$ for a frame time, and the second capacitor $C_2$ applies a data voltage, which is a compensated threshold voltage, to a gate of the first TFT $M_1$.

The operation of the OELD device that comprises the TFT layer and a pixel layer of the present embodiment will now be described. The third TFT $M_3$ turns "on" when the $n-1^{th}$ select signal $S_{[n-1]}$ activates, and then, the first TFT $M_1$, which is a driving thin film transistor, enters a diode-connection state, and stores a threshold voltage of the first TFT $M_1$ in the second capacitor $C_2$ since the fifth TFT $M_5$ is "off".

If a data voltage is inputted after the third TFT $M_3$ turns "off" in response to the $n-1^{th}$ select signal $S_{[n-1]}$ and the first TFT $M_1$ turns "on" in response to the $n^{th}$ select signal $S_{[n]}$, a applies the corrected data voltage which compensates a threshold voltage to a gate of the first TFT $M_1$.

At this time, if the fifth TFT $M_5$ turns "on" in response to the $n^{th}$ light emitting signal $E_{[n]}$, and emits light from the OELD by transmitting a current signal adjusted by a voltage applied to a gate of the first TFT $M_1$ to the OELD via the fifth TFT $M_5$.

FIG. 2C is a partial cross-sectional view of an OELD that comprises a pixel layer $R_P$ and a TFT layer $R_T$, that is, an electroluminescent unit and a pixel layer that comprises the first TFT $M_1$, which is a driving thin film transistor, and the fifth TFT $M_5$, which is a switching thin film transistor for supplying electrical signals to the pixel layer.

Referring to FIG. 2C, the TFT layer like the first TFT $M_1$ is formed on a portion of the substrate 110. A semiconductor active layer 130 of the first TFT MI is formed on a portion of the upper surface of a buffer layer 120 formed on a surface of the substrate 110. The semiconductor active layer 130 may be an amorphous silicon layer, or can be a polycrystalline silicon layer. Even though it is not depicted in detail, the semiconductor active layer 130 is composed of source and drain regions and a channel region doped with a P-type dopant or an N-type dopant. However, thin film transistor comprising the semiconductor active layer 130 may be configured in many different ways.

A gate electrode 150 of the first TFT $M_1$ may be disposed above a portion of the semiconductor active layer 130. The gate electrode 150 is preferably formed of a material, such as MoW and Al, in consideration of contact with a neighboring layer, surface flatness of stacked layers, and processing ability, but is not limited thereto.

A gate insulating layer 140 for insulating the gate electrode 150 from the semiconductor active layer 130 is disposed therebetween. An interlayer 160, which is an insulating layer, is a single layer or a multiple layer and is formed on the gate electrode 150 and the gate insulating layer 140. Source and drain electrodes 170a and 170b of the first TFT $M_1$ are formed on the interlayer 160. The source and drain electrodes 170a and 170b may each be formed of a metal such as MoW and can be heat treated after forming to provide a smooth ohmic contact with the semiconductor active layer 130.

A protection layer 180, which is an insulating layer, may be composed of a passivation layer and/or a planarizing layer for protecting and/or planarizing a lower layer and formed on the source and drain electrodes 170a and 170b. The protection layer 180, as depicted in FIG. 2C, may be a single layer composed of an inorganic material such as SiNx or an organic material layer such as benzocyclobutene or acryl, and can also be formed as a stack of a plurality of layers.

The first TFT $M_1$ electrically connects to the fifth TFT $M_5$, which acts as switching TFT, via an extension unit 170c of the drain electrode 170b. A fifth semiconductor active layer 230 of the fifth TFT $M_5$ is formed on the buffer layer 120 which is formed on a surface of the substrate 110. The fifth semiconductor active layer 230 is insulated from the second scan line and/or a fifth gate electrode 250 formed thereon by the gate insulating layer 140. The interlayer 160 and fifth source/drain electrodes 270a and 270b are formed on a surface of the fifth gate electrode. The fifth source and drain electrodes 270a and 270b and the fifth semiconductor active layer 230 are electrically connected via a contact hole formed in the interlayer 160 and the gate insulating layer 140. At least one protection layer 180 acting as an insulating layer is formed on the fifth source and drain electrodes 270a and 270b, and the pixel layer $R_P$ which comprises a first electrode layer 290, an electroluminescent unit 292, and a second electrode layer 400 stacked sequentially is formed on the protection layer 180.

A method of forming the pixel layer $R_P$ will now be described. First, after forming a first electrode layer 290, a pixel defining layer 291 is formed on a protection layer 180 outside a pixel opening region 294. The electroluminescent unit 292, which comprises a light emitting layer, is disposed on a surface of the first electrode layer 290 in the pixel opening region 294, and the second electrode layer 400 can be formed on the entire surface of the resultant product.

The electroluminescent unit 292 may be formed of a low molecule or polymer organic film. If the electroluminescent unit 292 is formed of a low molecule organic film, a HIL, a HTL, an EML, an ETL, and an EIL can be stacked in a single structure or a composite structure, and the low molecule organic materials can be used include copper phthalocyanine (CuPc), N,N'-Di (naphthalene-1-yl)-N,N'-diphenyl-benzidine (NPB), or tris-8-hydroxyquinoline aluminum (Alq3). The low molecule organic film can be formed using an evaporation method.

If the electroluminescent unit 292 is formed of a polymer organic film, it may be composed of a HTL and an EML, and the HTL can be formed of PEDOT and the EML can be formed of Poly-Phenylenevinylene (PPV) and Polyfluorene. The polymer organic film can be formed using various methods including a screen printing method and an ink jet printing method.

The second electrode layer 400 acts as a cathode and is deposited on an entire upper surface of the electroluminescent unit 292. The second electrode layer 400 is not limited to being deposited on an entire upper surface. It may be formed of a material such as Al/Ca, ITO, or Mg—Ag. The second electrode layer 400 may have many different forms such as a multiple layer and can further comprise an alkali or alkali earth fluoride layer such as a LiF layer.

A first scan line and/or a scan line extension unit 240 may be formed between the first TFT $M_1$ and the fifth TFT $M_5$. The first scan line 240 crosses an extension unit 170c of the drain electrode 170b of the first TFT $M_1$ not in contact with each other. As depicted in FIG. 2B, the first scan line 240 is a conduction layer via which the n–$1^{th}$ select signal $S_{[n-1]}$ is transmitted to the third and fourth TFTs $M_3$ and $M_4$ and comprises a width change part Aw, a width of which changes in a length direction of the first scan line since the TFTs have different design specifications. That is, as illustrated in the partial plan view depicted in FIG. 2C, the first scan line 240 as a conduction layer having a crossing region Ac where at least the first scan line 240 crosses with the extension unit 170c not in contact with each other, is disposed below the extension unit 170c extending from the drain electrode 170b. The first scan line 240 comprises a width change part $A_w$, a width of which changes from a first width $W_c$ to a second width $W_w$ or from a second width $W_w$ to a first width $W_c$. The width change part $A_w$ of the first scan line 240 can also be defined as a part whose cross section area changes in a length direction of the first scan line 240. The width change part $A_w$ is preferably formed away from a region where the first scan line 240 intersects the extension unit 170c of the drain electrode 170b. That is, the width change part $A_w$ may be formed adjacent to (and outside of) an edge of the extension unit 170c that forms a portion of the perimeter of the crossing region $A_c$.

Figure 2D:
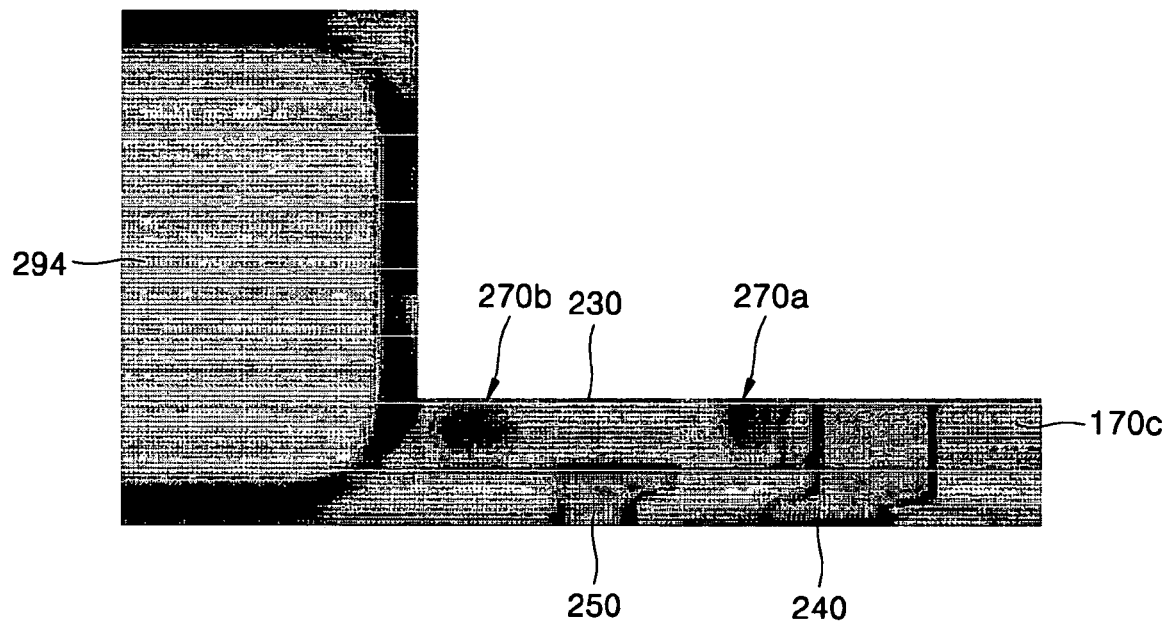
FIG. 2D is a partial magnified photograph of the pixel shown in FIG. 2C.

A partial layout of an electroluminescent unit manufactured according to the principles of the present invention is depicted in FIG. 2D. As shown in FIG. 2D, by disposing the width change part $A_w$ of the first scan line 240 away from a region where the first scan line 240 crosses a neighboring conductive layer, electrostatic damage at a severe bottleneck portion such as the width change part $A_w$ of the first scan line 240 which is easily damaged by the electrostatic discharge of the TFT layer, can be prevented, and accordingly, the failure of pixels can be prevented or reduced by preventing short circuits between neighboring conductive layers.

The aforementioned embodiments are exemplary, and the present invention is not limited thereto. That is, the aforementioned embodiments are described with respect to a conductive layer between an extension part of a drain electrode and a scan line, but the present invention can be applied to other conductive layers. Also, the aforementioned embodiments are described with respect to a TFT structure having a top gate type five transistors and two capacitors and an OELD device comprising the TFT structure, but the present invention can be modified in various forms such that the width change part of a conductive layer is disposed on a region that does not cross a neighboring conductive layer. The present invention can also be applied to an OELD device and an LCD device regardless of the type of transistors. Further, the present invention can also be applied to an electronic device which has more than two conductive layers crossing but not in contact with each other.

The present invention has the following advantages.

First, the inclusion of at least a width change part of a conductive layer in the TFT on a region that does not cross a neighboring conductive layer prevents or reduces the damage of an insulating layer between adjacent conductive layers caused by static electricity generated during the manufacturing and/or operating of the TFT, thereby preventing failure of the TFT.

Second, in a flat panel display device such as an OLED that comprises a TFT layer, the quality of an image can be improved by preventing pixel failure caused by electrostatic damage by disposing a width change part of a conductive layer in a region between the conductive layer that includes the width change part and a neighboring conductive layer such that the width change part does not cross the neighboring conductive layer if the TFT layer includes more than two conductive layers.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electronic device, comprising:
   more than two conductive layers crossing but not in contact with each other,
   wherein at least one of the conductive layers comprises a width change part formed away from a region where the at least one conductive layer crosses a neighboring conductive layer, the width change part being arranged in a pixel,
   wherein the at least one conductive layer extends along a first direction and comprises a first portion having a first width in a second direction perpendicular to the first direction and a second portion having a second width in the second direction, the second width being less than the first width,
   wherein the at least one conductive layer has the first width in the region where it crosses a neighboring conductive layer, and wherein the at least one conductive layer's width changes from the first width to the second width at the width change part.

2. The electronic device of claim 1, wherein the at least one conductive layers that comprises the width change part is a gate electrode of a TFT or an extension part of the gate electrode of the TFT.

3. The electronic device of claim 1, wherein the at least one conductive layers that comprises the width change part is a source or drain electrode of a TFT, or an extension part of the source or drain electrode of the TFT.

4. A thin film transistor (TFT) structure comprising more than two conductive layers crossing but not in contact with each other,
wherein at least one of the conductive layers comprises a width change part, formed away from a region where the at least one conductive layer crosses a neighboring conductive layer, and the width change part being arranged in a pixel,
wherein the at least one conductive layer extends along a first direction and comprises a first portion having a first width in a second direction perpendicular to the first direction and a second portion having a second width in the second direction, the second width being less than the first width,
wherein the at least one conductive layer has the first width in the region where it crosses a neighboring conductive layer, and
wherein the at least one conductive layer's width changes from the first width to the second width at the width change part.

5. The TFT structure of claim 4, wherein the at least one conductive layers that comprises the width change part is a gate electrode of the TFT or an extension part of the gate electrode.

6. The TFT structure of claim 4, wherein the at least one conductive layers that comprises the width change part is a source or drain electrode of the TFT, or and extension part of the source or drain electrode of the TFT.

7. A flat panel display device, comprising:
a substrate;
a TFT layer formed on the substrate; and
a pixel layer that comprises more than one pixel electrically connected to the TFT layer,
wherein the TFT layer comprises more than two conductive layers crossing but not in contact with each other,
wherein at least one of the conductive layers comprises a width change part formed away from a region where the at least one conductive layer crosses a neighboring conductive layer, the width change part being arranged in a pixel,
wherein the at least one conductive layer extends along a first direction and comprises a first portion having a first width in a second direction perpendicular to the first direction and a second portion having a second width in the second direction, the second width being less than the first width,
wherein the at least one conductive layer has the first width in the region where it crosses a neighboring conductive layer, and
wherein the at least one conductive layer's width changes from the first width to the second width at the width change part.

8. The flat panel display device of claim 7, wherein the at least one conductive layer that comprises the width change part is a gate electrode of the TFT or an extension part of the gate electrode of the TFT.

9. The flat panel display device of claim 7, wherein the at least one conductive layer that comprises the width change part is a source or drain electrode of the TFT, or an extension part of the source or drain electrode of the TFT.

10. The flat panel display device of claim 7, wherein the pixel layer is composed of:
a first electrode;
an intermediate layer comprising at least an emission layer and formed on the first electrode; and
a second electrode formed on the intermediate layer.

11. The flat panel display device of claim 7 further comprising at least one insulating layer formed over the TFT layer, wherein the pixel of the pixel layer is electrically connected to the TFT layer through a contact hole formed in the at least one insulating layer.

12. An electronic device, comprising:
more than two conductive layers crossing but not in contact with each other,
wherein at least one of the conductive layers comprises a part whose cross section area changes is formed away from a region where the at least one conductive layers crosses a neighboring conductive layer, and the part whose cross section area changes being arranged in a pixel,
wherein the at least one conductive layer extends along a first direction and comprises a first portion having a first cross section area in a second direction perpendicular to the first direction and a second portion having a second cross section area in the second direction, the second section area being less than the first cross section area,
wherein the at least one conductive layer has the first cross section area in the region where it crosses a neighboring conductive layer, and
wherein the at least one conductive layer's cross section area changes from the first cross section area to the second cross section area at the part whose cross section area changes.

13. The electronic device of claim 12, wherein the at least one conductive layers that comprises the part whose cross section area changes is a gate electrode of a TFT or an extension part of the gate electrode of the TFT.

14. The electronic device of claim 12, wherein the at least one conductive layer that comprises the part whose cross section area changes is a source or drain electrode of a TFT, or an extension part of the source or drain electrode of the TFT.

15. A thin film transistor (TFT) structure, comprising:
more than two conductive layers crossing but not in contact with each other,
wherein at least one of the conductive layers comprises a part whose cross section area changes formed away from a region where the at least one conductive layer crosses a neighboring conductive layer, and the part whose cross section area changes being arranged in a pixel,
wherein the at least one conductive layer extends along a first direction and comprises a first portion having a first cross section area in a second direction perpendicular to the first direction and a second portion having a second cross section area in the second direction, the second section area being less than the first cross section area,
wherein the at least one conductive layer has the first cross section area in the region where it crosses a neighboring conductive layer, and wherein the at least one conductive layer's cross section area changes from the first cross section area to the second cross section area at the part whose cross section area changes.

16. The TFT structure of claim 15, wherein the at least one conductive layer that comprises the part whose cross section area changes is a gate electrode of the TFT or an extension part of the gate electrode.

17. The TFT structure of claim 15, wherein the at least one conductive layer that comprises the part whose cross section area changes is a source or drain electrode of the TFT, or and extension part of the source or drain electrode of the TFT.

18. A flat panel display device, comprising:
  a substrate;
  a TFT layer formed on the substrate; and
  a pixel layer that comprises more than one pixel electrically connected to the TFT layer,
  wherein the TFT layer comprises more than two conductive layers crossing but not in contact with each other,
  wherein at least one of the conductive layers comprises a part whose cross section area changes formed away from a region where the at least one conductive layer crosses a neighboring conductive layer, the part whose cross section area changes being arranged in a pixel, and
  wherein the at least one conductive layer extends along a first direction and comprises a first portion having a first cross section area in a second direction perpendicular to the first direction and a second portion having a second cross section area in the second direction, the second section area being less than the first cross section area,
  wherein the at least one conductive layer has the first cross section area in the region where it crosses a neighboring conductive layer, and
  wherein the at least one conductive layer's cross section area changes from the first cross section area to the second cross section area at the part whose cross section area changes.

19. The flat panel display device of claim 18, wherein the at least one conductive layer that comprises the part whose cross section area changes is a gate electrode of the TFT or an extension part of the gate electrode of the TFT.

20. The flat panel display device of claim 19, wherein the at least one conductive layer that comprises the part whose cross section area changes is a source or drain electrode of the TFT, or an extension part of the source or drain electrode of the TFT.

21. The flat panel display device of claim 19, wherein the pixel layer is composed of:
  a first electrode;
  an intermediate layer comprising at least an emission layer and formed on the first electrode; and
  a second electrode formed on the intermediate layer.

22. The flat panel display device of claim 19, further comprising:
  at least one insulating layer formed over the TFT layer, wherein the pixel of the pixel layer is electrically connected to the TFT layer through a contact hole formed in the at least one insulating layer.

* * * * *